(12) United States Patent
Xu et al.

(10) Patent No.: US 12,324,337 B2
(45) Date of Patent: *Jun. 3, 2025

(54) DISPLAY PANEL AND DISPLAY DEVICE

(71) Applicant: BOE Technology Group Co., Ltd., Beijing (CN)

(72) Inventors: Zhiqiang Xu, Beijing (CN); Wei Qin, Beijing (CN); Weixing Liu, Beijing (CN); Kai Guo, Beijing (CN); Tieshi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/238,019

(22) Filed: Aug. 25, 2023

(65) Prior Publication Data

US 2023/0403902 A1 Dec. 14, 2023

Related U.S. Application Data

(63) Continuation of application No. 17/199,489, filed on Mar. 12, 2021, now Pat. No. 11,778,882.

(30) Foreign Application Priority Data

Oct. 9, 2020 (CN) .......................... 202011074634.3

(51) Int. Cl.
*H10K 59/35* (2023.01)
*H01L 27/12* (2006.01)
*H10D 86/40* (2025.01)
*H10D 86/60* (2025.01)
*H10K 59/12* (2023.01)
(Continued)

(52) U.S. Cl.
CPC ......... *H10K 59/353* (2023.02); *H10D 86/441* (2025.01); *H10D 86/60* (2025.01); *H10K 59/12* (2023.02); *H10K 59/351* (2023.02); *H10K 71/00* (2023.02); *G09G 3/2003* (2013.01); *G09G 2300/0452* (2013.01); *H10K 59/1201* (2023.02); *H10K 59/65* (2023.02)

(58) Field of Classification Search
CPC ......... H01L 27/3211–3218; G09G 2300/0452; H10K 59/35–353
See application file for complete search history.

(56) References Cited

U.S. PATENT DOCUMENTS

| | | | | |
|---|---|---|---|---|
| 11,778,882 B2 * | 10/2023 | Xu | ........................ | H10K 59/351 |
| 2018/0129328 A1 * | 5/2018 | Park | ...................... | G06F 3/0412 |
| 2021/0159286 A1 * | 5/2021 | Ma | ........................ | H10K 59/131 |

FOREIGN PATENT DOCUMENTS

CN 212323004 U * 1/2021 ............. H01L 27/32

OTHER PUBLICATIONS

Machine translation, Xu, Chinese Pat. Pub. No. CN212323004U, translation date: Aug. 8, 2024, Espacenet, all pages. (Year: 2024).*

* cited by examiner

*Primary Examiner* — Victoria K. Hall
(74) *Attorney, Agent, or Firm* — Lippes Mathias LLP

(57) ABSTRACT

A display panel includes a base substrate and a plurality of sub-pixel groups. The plurality of sub-pixel groups includes a first sub-pixel group and a second sub-pixel group. The first sub-pixel group includes two adjacent sub-pixels with a first interval therebetween, and the second sub-pixel group includes two adjacent sub-pixels with a second interval therebetween. The first interval is different from the second interval.

20 Claims, 13 Drawing Sheets

(51) Int. Cl.
_H10K 71/00_ (2023.01)
_G09G 3/20_ (2006.01)
_H10K 59/65_ (2023.01)

DISPLAY PANEL AND DISPLAY DEVICE

This application is a continuation application of U.S. application Ser. No. 17/199,489, filed on Mar. 12, 2021, now U.S. Pat. No. 11,778,882, issued Oct. 3, 2023, and claims priority to Chinese Patent Application No. 202011074634.3, filed on Oct. 9, 2020 and entitled "DISPLAY PANEL AND DISPLAY DEVICE", which is incorporated herein by reference in its entirety.

TECHNICAL FIELD

The present disclosure relates to the field of display technologies, and in particular to a display panel and a display device.

BACKGROUND

Transparent display panels have good transparency and can display images, and thus are widely used.

In the related art, the transparent display panel includes: a base substrate and a plurality of pixel columns disposed on the base substrate. There is no gap between the plurality of pixels included in each pixel column, there is a gap between two adjacent pixel columns, and external light can pass through the gap between the two adjacent pixel columns.

SUMMARY

The present disclosure provides a display panel and a display device. The technical solutions are as follows.

In an aspect, a display panel is provided. The display panel includes: a base substrate; and a plurality of sub-pixel groups disposed on the base substrate and arranged along a first direction, wherein the sub-pixel group includes: a plurality of sub-pixels arranged along a second direction, and the second direction intersects the first direction; wherein the plurality of sub-pixel groups includes a first sub-pixel group and a second sub-pixel group which are adjacent to each other, the first sub-pixel group includes two adjacent sub-pixels with a first interval therebetween, the second sub-pixel group includes two adjacent sub-pixels with a second interval therebetween, and the first interval is different from the second interval.

In some embodiments, the sub-pixels in the plurality of sub-pixel groups are divided into a plurality of pixels, the pixel includes a plurality of sub-pixels, and two adjacent pixels have a gap in the second direction.

In some embodiments, a connecting line between two of the plurality of sub-pixels included in the pixel intersects both the first direction and the second direction.

In some embodiments, the pixel includes a first sub-pixel, a second sub-pixel, a third sub-pixel, and a fourth sub-pixel; wherein the first sub-pixel and the second sub-pixel are arranged along the first direction; and the third sub-pixel and the fourth sub-pixel are disposed on both sides of the first sub-pixel respectively, and the third sub-pixel, the first sub-pixel, and the fourth sub-pixel are arranged along the second direction.

In some embodiments, the first sub-pixel group includes: a plurality of first sub-pixels, a plurality of third sub-pixels, and a plurality of fourth sub-pixels; and the second sub-pixel group includes: a plurality of second sub-pixels; wherein the first interval is smaller than the second interval.

In some embodiments, a length of each sub-pixel along the second direction is m, and the first interval and the second interval satisfy: $h2-h1=2\times m$, wherein $h1$ is the first interval, and $h2$ is the second interval.

In some embodiments, the first interval is equal to the length of one sub-pixel along the second direction, and the second interval is equal to the length of three sub-pixels along the second direction.

In some embodiments, the first interval is equal to the length of two sub-pixels along the second direction, and the second interval is equal to the length of four sub-pixels along the second direction.

In some embodiments, the plurality of sub-pixel groups further includes a third sub-pixel group adjacent to the second sub-pixel group, the third sub-pixel group has two adjacent sub-pixels with a third interval therebetween, and the third interval is different from the second interval.

In some embodiments, the first sub-pixel group includes: a plurality of first sub-pixels, a plurality of third sub-pixels, and a plurality of fourth sub-pixels, the second sub-pixel group includes: a plurality of first sub-pixels, a plurality of second sub-pixels, a plurality of third sub-pixels, and a plurality of fourth sub-pixels, and the third sub-pixel group includes: a plurality of second sub-pixels; wherein the third interval is greater than the first interval, and the first interval is greater than the second interval.

In some embodiments, the length of each sub-pixel along the second direction is m; and the first interval, the second interval, and the third interval satisfy: $h3-h1=2\times m$; $h1=2\times h2+m$; $h3=3\times h2+m$, wherein $h1$ is the first interval, $h2$ is the second interval, and $h3$ is the third interval.

In some embodiments, the first interval is equal to the length of five sub-pixels along the second direction, the second interval is equal to the length of two sub-pixels along the second direction, and the third interval is equal to the length of seven sub-pixels along the second direction.

In some embodiments, the first sub-pixel group includes: a plurality of first sub-pixels, a plurality of third sub-pixels, and a plurality of fourth sub-pixels, the second sub-pixel group includes: a plurality of second sub-pixels, and the third sub-pixel group includes: a plurality of first sub-pixels, a plurality of third sub-pixels, and a plurality of fourth sub-pixels; wherein the third interval is equal to the first interval, and the first interval is greater than the second interval.

In some embodiments, the length of each sub-pixel along the second direction is m; and the first interval, the second interval, and the third interval satisfy: $h1=h3=2\times h2-m$, wherein $h1$ is the first interval, $h2$ is the second interval, and $h3$ is the third interval.

In some embodiments, the first interval is equal to the length of five sub-pixels along the second direction, the second interval is equal to the length of three sub-pixels along the second direction, and the third interval is equal to the length of five sub-pixels along the second direction.

In some embodiments, a color of the first sub-pixel is one of red and blue, a color of the second sub-pixel is the other of red and blue, and a color of the third sub-pixel and a color of the fourth sub-pixel are both green.

In some embodiments, the first direction is a pixel column direction, and the second direction is a pixel row direction.

In another aspect, a display device is provided. The display device includes: a drive circuit and a display panel; wherein the display panel includes: a base substrate; and a plurality of sub-pixel groups disposed on the base substrate and arranged along a first direction, wherein the sub-pixel group includes: a plurality of sub-pixels arranged along a second direction, and the second direction intersects the first direction; the plurality of sub-pixel groups includes a first sub-pixel group and a second sub-pixel group which are adjacent to each other, the first sub-pixel group has two adjacent sub-pixels with a first interval, the second sub-pixel group has two adjacent sub-pixels with a second interval, and the first interval is different from the second interval; and the drive circuit is connected to the plurality of sub-pixels, and the drive circuit is configured to provide drive signals for the plurality of sub-pixels.

In some embodiments, the display device further includes: a plurality of drive lines, wherein one end of the drive line is connected to the drive circuit, and the other end of the drive line is connected to the plurality of sub-pixels; and an orthographic projection of the drive line on the base substrate is in an edge region of an orthographic projection of a gap between two adjacent sub-pixels with an interval on the base substrate.

BRIEF DESCRIPTION OF THE DRAWINGS

For clearer descriptions of the technical solutions in the embodiments of the present disclosure, the following briefly introduces the accompanying drawings required for describing the embodiments. The accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

Figure 1:
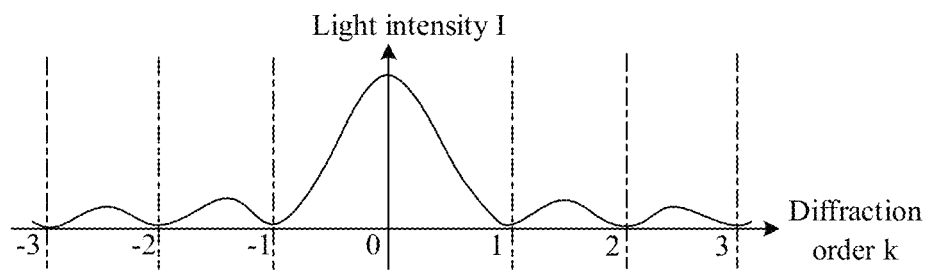
FIG. 1 is a schematic diagram of light intensity of single-slit diffraction according to some embodiments of the present disclosure.
Figure 2:
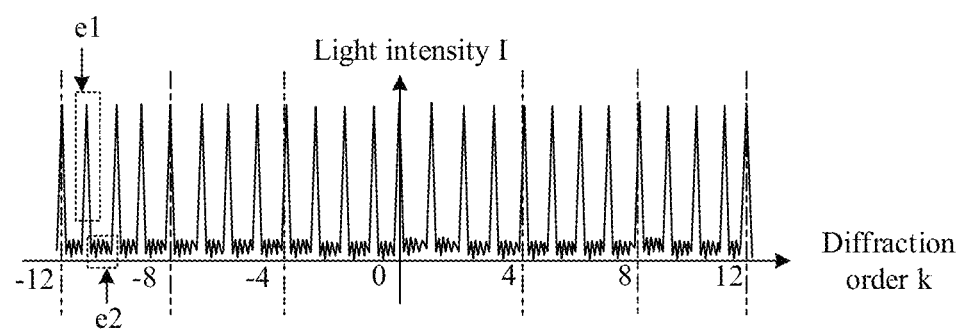
FIG. 2 is a schematic diagram of light intensity of multi-slit interference according to some embodiments of the present disclosure.

Single-slit diffraction is a phenomenon that light waves bypass an obstacle and continue to propagate when light encounters the obstacle during propagation. As shown in FIG. 1, in the single-slit diffraction, the smaller the absolute value of a diffraction order k is, the greater the light intensity I is; and the larger the absolute value of the diffraction order k is, the less the light intensity I is, where k is an integer. Light interference is a phenomenon that two or more columns of light overlap each other when meeting in space, and the light is always intensified in some regions e1 and always weakened in other regions e2, thereby forming a stable intensity-weakness distribution, as shown in FIG. 2.

Figure 3:
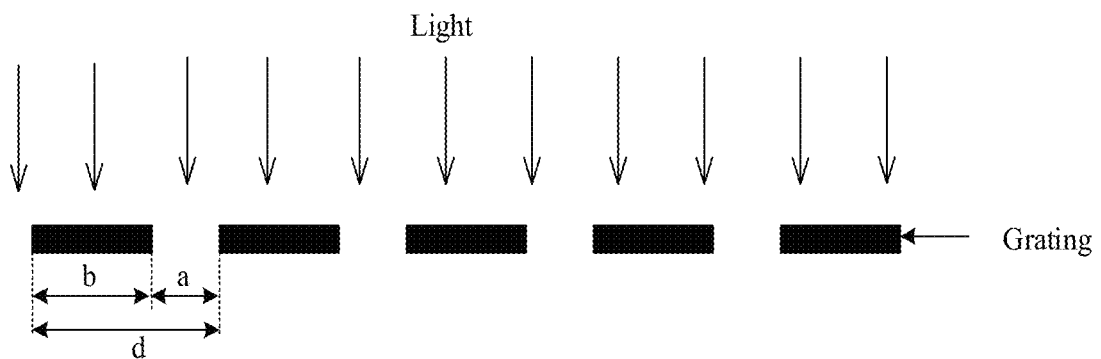
FIG. 3 is a schematic structural diagram of a grating according to some embodiments of the present disclosure.

FIG. 3 is a schematic structural diagram of a grating according to some embodiments of the present disclosure. Referring to FIG. 3, the grating is an optical element including a plurality of parallel slits with an equal width and equal interval. In FIG. 3, the width of a light-transmitting region (the light-transmitting region is also called a slit) is a, the width of an opaque region is b, and the sum of the width of the light-transmitting region and the width of the opaque region is called a length d of one period of the grating, that is, d=a+b.

Figure 4:
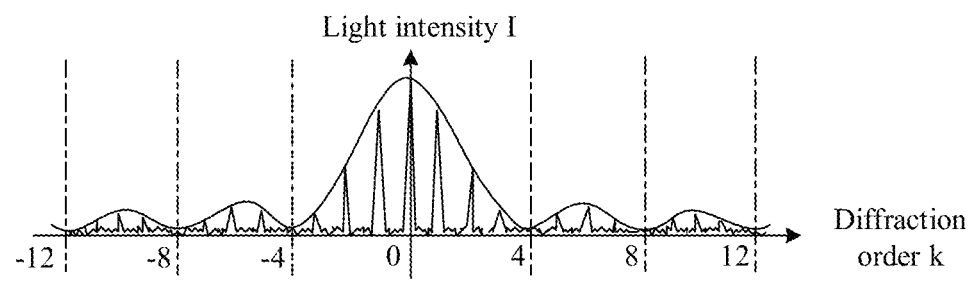
FIG. 4 is a schematic diagram of light intensity of multi-slit diffraction according to some embodiments of the present disclosure.

The light intensity curve of multi-slit interference is shown in FIG. 4, and the light intensity of multi-slit interference satisfies:

$$I = I_0 \left(\frac{\sin\alpha}{\alpha}\right)^2 \left(\frac{\sin N\beta}{\sin\beta}\right)^2, \quad \text{Formula (1)}$$

where $I_0$ refers to an initial light intensity when the light irradiates the grating without bypassing the obstacle to continue to propagate.

$$\frac{\sin\alpha}{\alpha}$$

refers to a single-slit diffraction factor, and $$\frac{\sin N\beta}{\sin \beta}$$

refers to a multi-slit interference factor. α satisfies:

$$\alpha = \frac{\pi a \sin \theta}{\lambda}.$$

β satisfies:

$$\beta = \frac{\pi d \sin \theta}{\lambda}.$$

θ is a diffraction angle, λ is a wavelength of light, N is the number of light-transmitting regions, and N is a positive integer greater than or equal to 1.

With reference to the above Formula (1), it can be seen that the single-slit diffraction is related to the width a of the light-transmitting region, and the multi-slit interference is related to the length d of one period of the grating. In addition, the multi-slit diffraction is a combined effect of the single-slit diffraction simultaneously generated by each single slit and the multi-light interference generated by parallel light diffracted by each single slit. The diffraction effect of the multi-slit diffraction can be reduced by reducing the width a of the light-transmitting region or increasing the length d of one period of the grating.

In some embodiments, a dark stripe of the single-slit diffraction satisfies: a×sin θ=±kλ, and a bright fringe of the multi-slit interference satisfies: d×sin θ=±kλ, where k is the diffraction order shown in FIG. 1 to FIG. 3.

Figure 5:
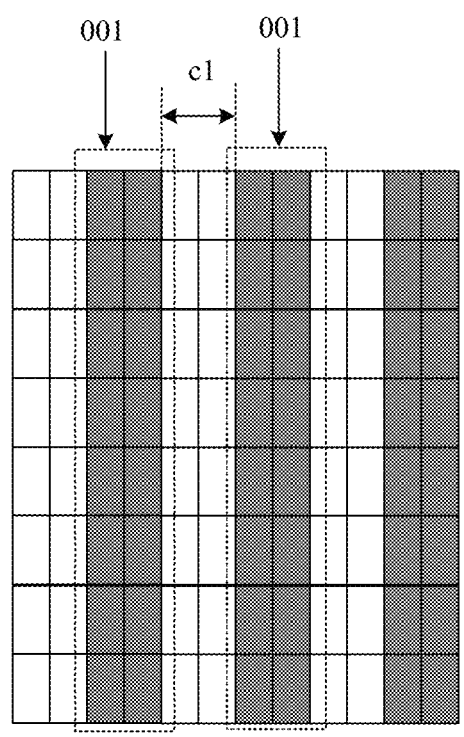
FIG. 5 is a schematic structural diagram of a transparent display panel in the related art.
Figure 6:
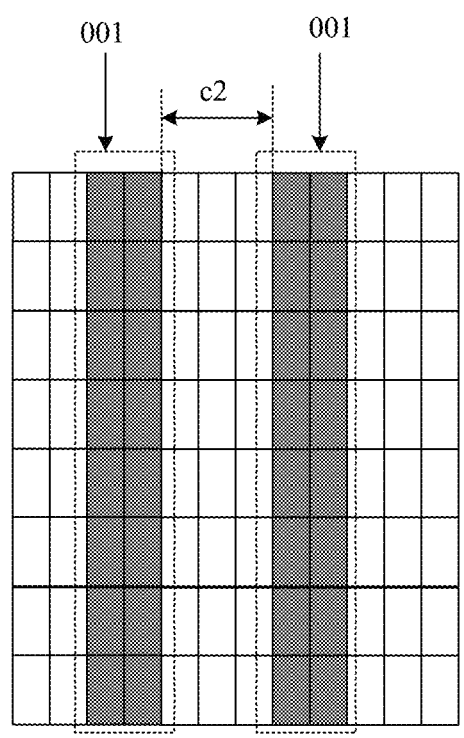
FIG. 6 is a schematic structural diagram of another transparent display panel in the related art.
Figure 7:
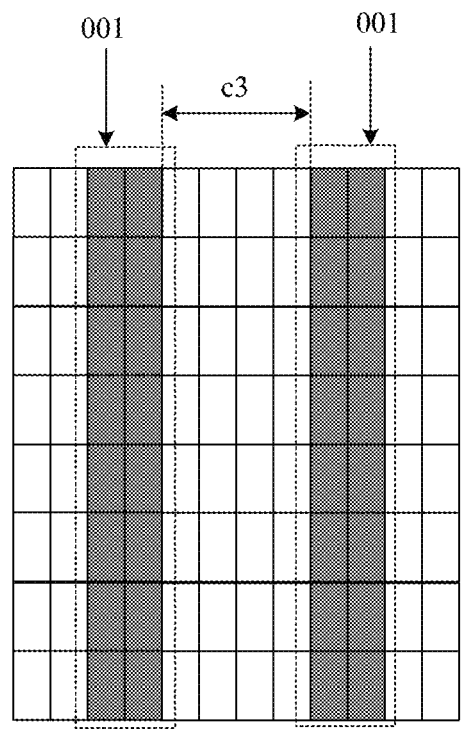
FIG. 7 is a schematic structural diagram of yet another transparent display panel in the related art.

In the related art, referring to FIG. 5 to FIG. 7, the transparent display panel includes: a plurality of pixel columns 001. There is no gap between multiple pixels included in each pixel column 001, and there is a gap between every two adjacent pixel columns 001. The gap between every two adjacent pixel columns 001 is a light-transmitting region, and light can pass through the gap between every two adjacent pixel columns. That is, the transparent display panel is regarded as a grating composed of multiple light-transmitting regions.

The gap c1 between two adjacent pixel columns 001 in FIG. 5 is smaller than the gap c2 between two adjacent pixel columns 001 in FIG. 6, and the gap c2 between two adjacent pixel columns 001 in FIG. 6 is smaller than the gap c3 between two adjacent pixel columns 001 in FIG. 7. That is, the width of the light-transmitting region in the transparent display panel shown in FIG. 5 is smaller than the width of the light-transmitting region in the transparent display panel shown in FIG. 6, and the width of the light-transmitting region in the transparent display panel shown in FIG. 6 is smaller than the width of the light-transmitting region in the transparent display panel shown in FIG. 7.

Figure 8:
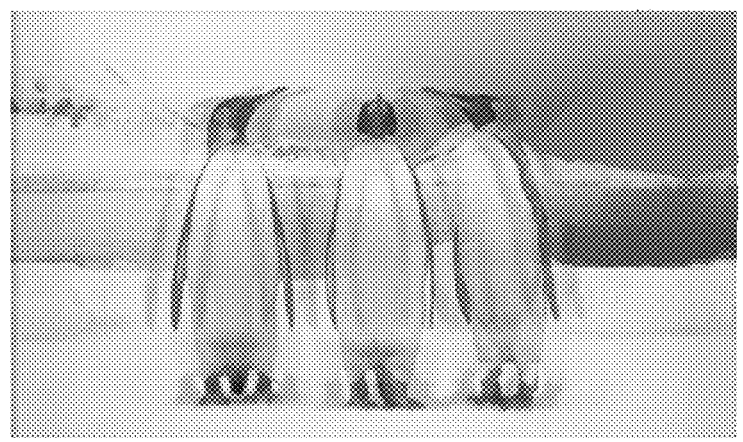
FIG. 8 is a simulation diagram of a diffraction effect of the transparent display panel shown in FIG. 5.
Figure 9:
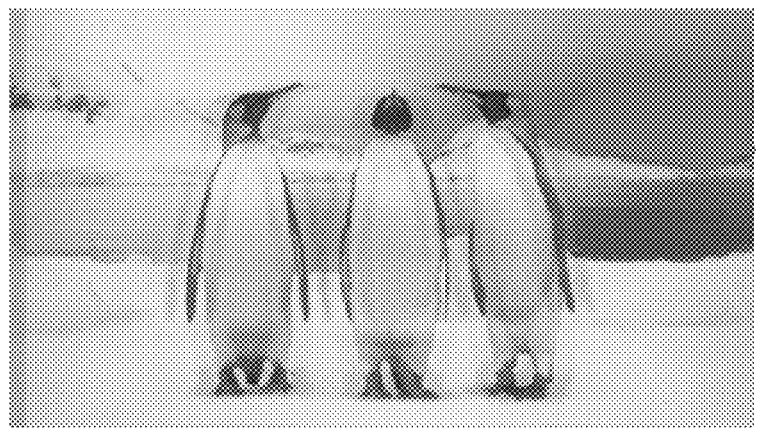
FIG. 9 is a simulation diagram of a diffraction effect of the transparent display panel shown in FIG. 6.
Figure 10:
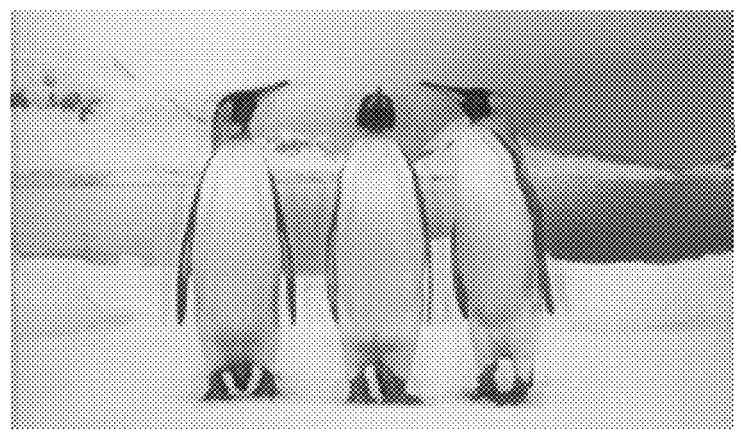
FIG. 10 is a simulation diagram of a diffraction effect of the transparent display panel shown in FIG. 7.

The diffraction effect of the transparent display panel shown in FIG. 5 is simulated as shown in FIG. 8, the diffraction effect of the transparent display panel shown in FIG. 6 is simulated as shown in FIG. 9, and the diffraction effect of the transparent display panel shown in FIG. 7 is simulated as shown in FIG. 10. It can be seen in conjunction with FIG. 8 to FIG. 10 that the ghost image of an image displayed on the transparent display panel shown in FIG. 5 is more obvious than that of the image displayed on the transparent display panel shown in FIG. 6, and the ghost image of the image displayed on the transparent display panel shown in FIG. 6 is more obvious than that of the image displayed on the transparent display panel shown in FIG. 7. That is, the diffraction effect of the transparent display panel shown in FIG. 5 is stronger than that of the transparent display panel shown in FIG. 6, and the diffraction effect of the transparent display panel shown in FIG. 6 is stronger than that of the transparent display panel shown in FIG. 7.

In the related art, by increasing the gap between adjacent pixel columns in the transparent display panel, the diffraction effect of the transparent display panel can be reduced. However, referring to FIG. 10, after increasing the gap between adjacent pixel columns in the transparent display panel, the ghost image of the image displayed on the transparent display panel is still obvious, and the display effect of the transparent display panel is poor.

Figure 11:
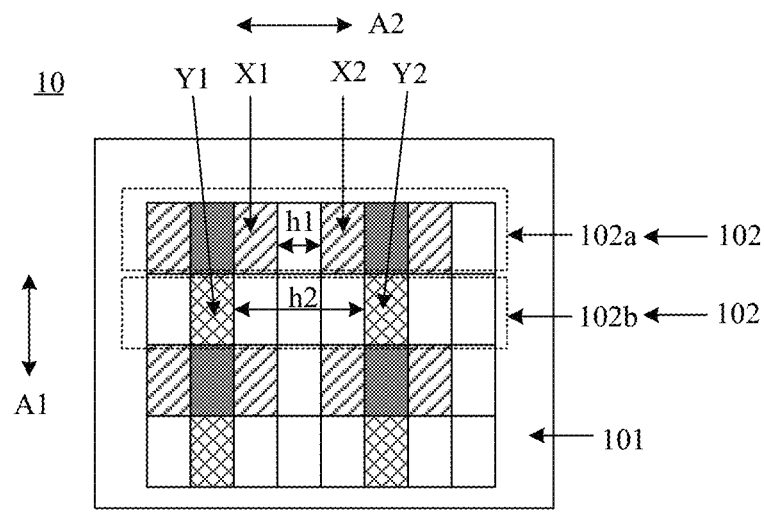
FIG. 11 is a schematic structural diagram of a display panel according to some embodiments of the present disclosure.

The display panel according to some embodiments of the present disclosure can solve the problem of poor display effect of the display panel in the related art. Referring to FIG. 11, the display panel 10 includes: a base substrate 101 and a plurality of sub-pixel groups 102. The plurality of sub-pixel groups 102 are disposed on the base substrate 101 and arranged along a first direction A1. Four sub-pixel groups 102 are shown in FIG. 11. The sub-pixel group 102 includes a plurality of sub-pixels arranged along a second direction A2. The second direction A2 intersects the first direction A1. For example, the second direction A2 in FIG. 11 is perpendicular to the first direction A1.

Referring to FIG. 11, the plurality of sub-pixel groups 102 includes a first sub-pixel group 102*a* and a second sub-pixel group 102*b* which are adjacent to each other. The first sub-pixel group 102*a* includes two adjacent sub-pixels (X1 and X2) with a first interval h1 therebetween. The second sub-pixel group 102*b* includes two adjacent sub-pixels (Y1 and Y2) with a second interval h2 therebetween. The first interval h1 is different from the second interval h2.

The interval between two sub-pixels included in the sub-pixel group refers to the distance between the side of a first sub-pixel close to a second sub-pixel and the side of the second sub-pixel close to the first sub-pixel. Referring to FIG. 11, the first interval h1 between the sub-pixel X1 and the sub-pixel X2 refers to the distance between the side of the sub-pixel X1 close to the sub-pixel X2 and the side of the sub-pixel X2 close to the sub-pixel X1. The second interval h2 between the sub-pixel Y1 and the sub-pixel Y2 refers to the distance between the side of the sub-pixel Y1 close to the sub-pixel Y2 and the side of the sub-pixel Y2 close to the sub-pixel Y1.

In the embodiments of the present disclosure, the first interval h1 between the two adjacent sub-pixels (X1 and X2) in the first sub-pixel group 102*a* is different from the second interval h2 between the two adjacent pixels (Y1 and Y2) in the second sub-pixel group 102*b*, so the diffraction order of light passing through the gap between the two adjacent sub-pixels (X1 and X2) in the first sub-pixel group 102*a* is different from the diffraction order of the light passing through the gap between the two adjacent sub-pixels (Y1 and Y2) in the second sub-pixel group 102*b*. Therefore, the diffraction effect of the light emitting from the gap between adjacent sub-pixels can be reduced, and the display effect of the display panel 10 is better.

In summary, the embodiments of the present disclosure provide a display panel. In the display panel, the first sub-pixel group has two adjacent sub-pixels with the first interval, and the second sub-pixel group has two adjacent sub-pixels with the second interval. The first interval is different from the second interval, so that the diffraction order of the light passing through the gap between the two sub-pixels in the first sub-pixel group is different from that of the light passing through the gap between the two sub-pixels in the second sub-pixel group. Therefore, the diffraction effect can be reduced, and the display effect of the display panel is improved.

In some embodiments, the first direction A1 is a pixel column direction, and the second direction A2 is a pixel row direction. Certainly, the first direction A1 is a pixel row direction, and the second direction A2 is a pixel column direction, which is not limited in the embodiments of the present disclosure.

Figure 12:
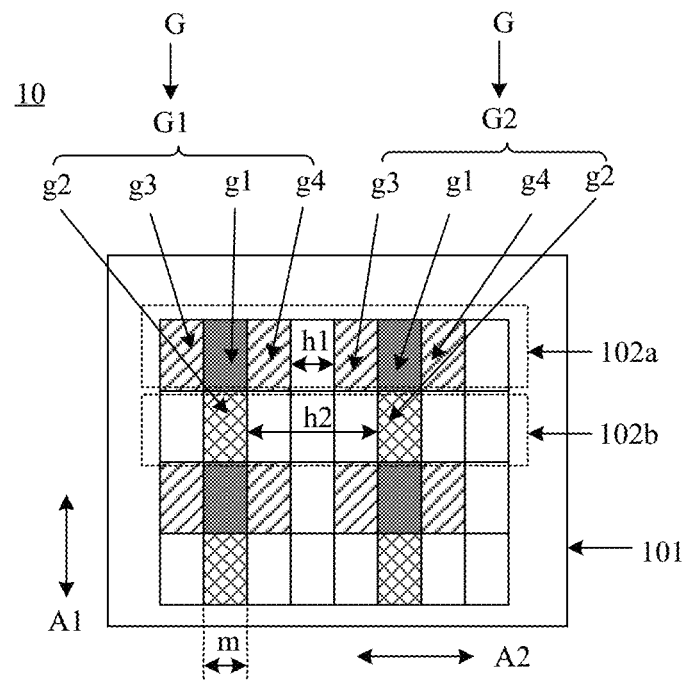
FIG. 12 is a schematic structural diagram of another display panel according to some embodiments of the present disclosure.

Referring to FIG. 12, it can be seen that the sub-pixels in the plurality of sub-pixel groups 102 are divided into a plurality of pixel islands. In some embodiments, referring to FIGS. 12 and 13, the plurality of pixel islands include a plurality of pixel island columns along the first direction A1 and a plurality of pixel island rows along the second direction A2; the pixel islands in a same column are aligned along the first direction A1, the pixel islands in a same row are aligned along the second direction A2, adjacent pixel islands are arranged in a staggered manner in columns and in rows.

Each of the pixel islands includes a pixel G. Each pixel G includes a plurality of sub-pixels, and there is a gap between two adjacent pixels G in the second direction A2. Thus, there is a gap between two adjacent sub-pixels in the sub-pixel group 102. The color of the combined light emitted from the plurality of sub-pixels included in each pixel is white.

In some embodiments, in the plurality of sub-pixels included in the pixel G in the display panel 10, there is a connecting line between two of the sub-pixels which intersects both the first direction A1 and the second direction A2. That is, the plurality of sub-pixels included in the pixel G are not arranged in the same direction (the first direction A1 or the second direction A2). In addition, in the plurality of sub-pixels included in each pixel, at least two sub-pixels belong to different sub-pixel groups.

Referring to FIG. 12, it can be seen that each pixel G includes a first sub-pixel g1, a second sub-pixel g2, a third sub-pixel g3, and a fourth sub-pixel g4. That is, the pixel G includes four sub-pixels. The first sub-pixel g1 and the second sub-pixel g2 are arranged along the first direction A1. The third sub-pixel g3 and the fourth sub-pixel g4 are respectively disposed on both sides of the first sub-pixel g1, and the third sub-pixel g3, the first sub-pixel g1, and the fourth sub-pixel g4 are arranged along the second direction A2.

Referring to FIG. 12, for each pixel G, the connecting line between the second sub-pixel g2 and the third sub-pixel g3, and the connecting line between the second sub-pixel g2 and the fourth sub-pixel g4 intersect both the first direction A1 and the second direction A2. For each pixel G, the first sub-pixel g1, the second sub-pixel g2, the third sub-pixel g3, and the fourth sub-pixel g4 are arranged in a "T" shape.

In some embodiments, in the four sub-pixels included in the pixel G, the color of at least one sub-pixel is red (R), the color of at least one sub-pixel is green (G), and the color of at least one sub-pixel is blue (B).

Exemplarily, the color of the first sub-pixel g1 is one of red and blue, the color of the second sub-pixel g2 is the other of red and blue, and the color of the third sub-pixel g3 and the color of the fourth sub-pixel g4 are both green. That is, in the four sub-pixels included in the pixel G, the color of one sub-pixel is red, the color of one sub-pixel is blue, and the color of the other two sub-pixels is green.

In the embodiments of the present disclosure, the pixel G includes less or more sub-pixels, which is not limited in the embodiments of the present disclosure, as long as the color of the combined light emitted from the plurality of sub-pixels included in the pixel G is white.

Referring to FIG. 12, it can be seen that the first sub-pixel group 102a includes: a plurality of first sub-pixels g1, a plurality of third sub-pixels g3, and a plurality of fourth sub-pixels g4, and the second sub-pixel group 102b includes: a plurality of second sub-pixels g2. The first interval h1 is smaller than the second interval h2.

In the embodiments of the present disclosure, referring to FIG. 12, the first pixel G1 and the second pixel G2 are adjacent to each other and are arranged along the second direction A2. The sub-pixels sequentially arranged along the second direction A2 in the first sub-pixel group 102a include: the third sub-pixel g3 of the first pixel G1, the first sub-pixel g1 of the first pixel G1, the fourth sub-pixel g4 of the first pixel G1, the third sub-pixel g3 of the second pixel G2, the first sub-pixel g1 of the second pixel G2, and the fourth sub-pixel g4 of the second pixel G2. Furthermore, the sub-pixels sequentially arranged along the second direction A2 in the second sub-pixel group 102b include: the second sub-pixel g2 of the first pixel G1 and the second sub-pixel g2 of the second pixel G2.

The first pixel G1 and the second pixel G2 have a gap therebetween along the second direction A2. Referring to FIG. 12, the two adjacent sub-pixels with the first interval h1 therebetween in the first sub-pixel group 102a include: the fourth sub-pixel g4 of the first pixel G1 and the third sub-pixel g3 of the second pixel G2. That is, the fourth sub-pixel g4 of the first pixel G1 and the third sub-pixel g3 of the second pixel G2 have the first interval h1 therebetween along the second direction A2.

In addition, the two adjacent sub-pixels with the second interval h2 therebetween in the second sub-pixel group 102b include: the second sub-pixel g2 of the first pixel G1 and the second sub-pixel g2 of the second pixel G2. That is, the second sub-pixel g2 of the first pixel G1 and the second sub-pixel g2 of the second pixel G2 have the second interval h2 therebetween along the second direction A2.

In the embodiments of the present disclosure, the length of each sub-pixel included in the display panel 10 along the second direction A2 is the same. Referring to FIG. 11, the first interval h1 is equal to the length of one sub-pixel along the second direction A2, and the second interval h2 is equal to the length of three sub-pixels along the second direction A2. The white filling in FIG. 11 or FIG. 12 indicates that no sub-pixels are disposed.

Figure 13:
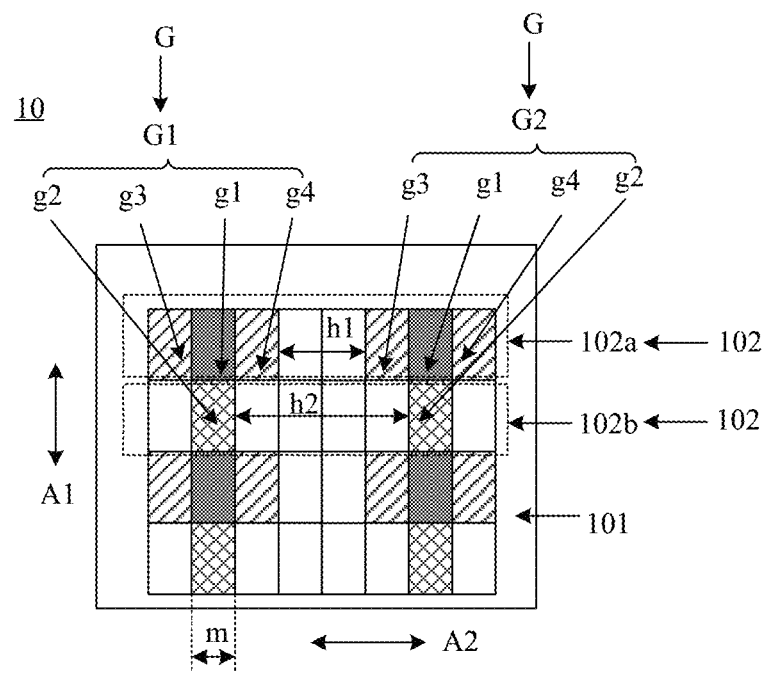
FIG. 13 is a schematic structural diagram of yet another display panel according to some embodiments of the present disclosure.

Alternatively, referring to FIG. 13, the first interval h1 is equal to the length of two sub-pixels in the second direction A2, and the second interval h2 is equal to the length of four sub-pixels in the second direction A2.

Figure 14:
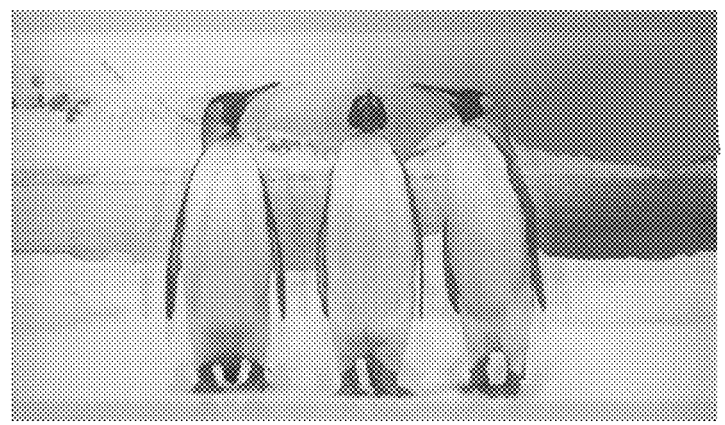
FIG. 14 is a simulation diagram of a diffraction effect of the display panel shown in FIG. 11.
Figure 15:
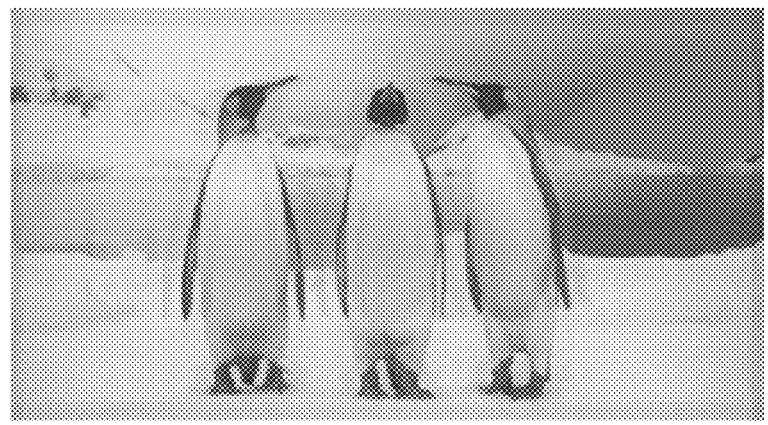
FIG. 15 is a simulation diagram of a diffraction effect of the display panel shown in FIG. 13.

The diffraction effect of the display panel shown in FIG. 11 is simulated as shown in FIG. 14, and the diffraction effect of the display panel shown in FIG. 13 is simulated as shown in FIG. 15. It can be seen in conjunction with FIG. 14 and FIG. 15 that the ghost image of the image displayed on the display panel shown in FIG. 11 is more obvious than the ghost image of the image displayed on the display panel shown in FIG. 13. That is, the display panel shown in FIG. 11 has a strong diffraction effect, and the display panel shown in FIG. 13 has a weak diffraction effect.

The diffraction effect of the display panel 10 is negatively correlated with the first interval h1 and the second interval h2. The larger the first interval h1 and the second interval h2 are, the weaker the diffraction effect of the display panel 10 is. The smaller the first interval h1 and the second interval h2 are, the stronger the diffraction effect of the display panel 10 is.

In the embodiments of the present disclosure, the first interval h1 and the second interval h2 are equal to the length of other numbers of sub-pixels along the second direction A2, which is not limited in the embodiments of the present disclosure. However, if the arrangement of the pixels in the display panel is the same as the arrangement shown in FIG. 11 and FIG. 13, and only the gap between adjacent pixels in the second direction A2 is adjusted (that is, the sizes of the first interval h1 and the second interval h2 are adjusted), the difference between the second interval h2 and the first interval h1 is equal to the length of two sub-pixels along the second direction A2.

That is, in the display panel 10 shown in FIG. 11 and FIG. 13, the first interval h1 and the second interval h2 satisfy: h2−h1=2×m, where m is the length of one sub-pixel along the second direction A2.

Figure 16:
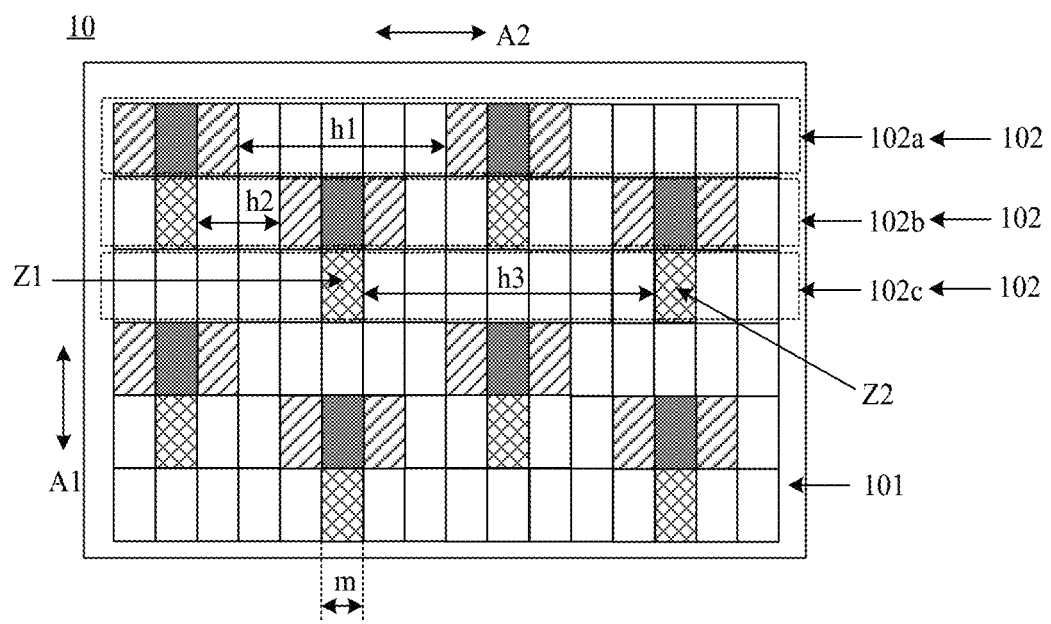
FIG. 16 is a schematic structural diagram of still another display panel according to some embodiments of the present disclosure.

FIG. 16 is a schematic structural diagram of yet another display panel according to some embodiments of the present disclosure. It can also be seen with reference to FIG. 16 that the plurality of sub-pixel groups 102 further includes a third sub-pixel group 102c adjacent to the second sub-pixel group 102b. The third sub-pixel group 102c has two adjacent sub-pixels (Z1 and Z2) with a third interval h3 therebetween. Since the third sub-pixel group 102c is adjacent to the second sub-pixel group 102b, the third interval h3 is different from the second interval h2.

Figure 17:
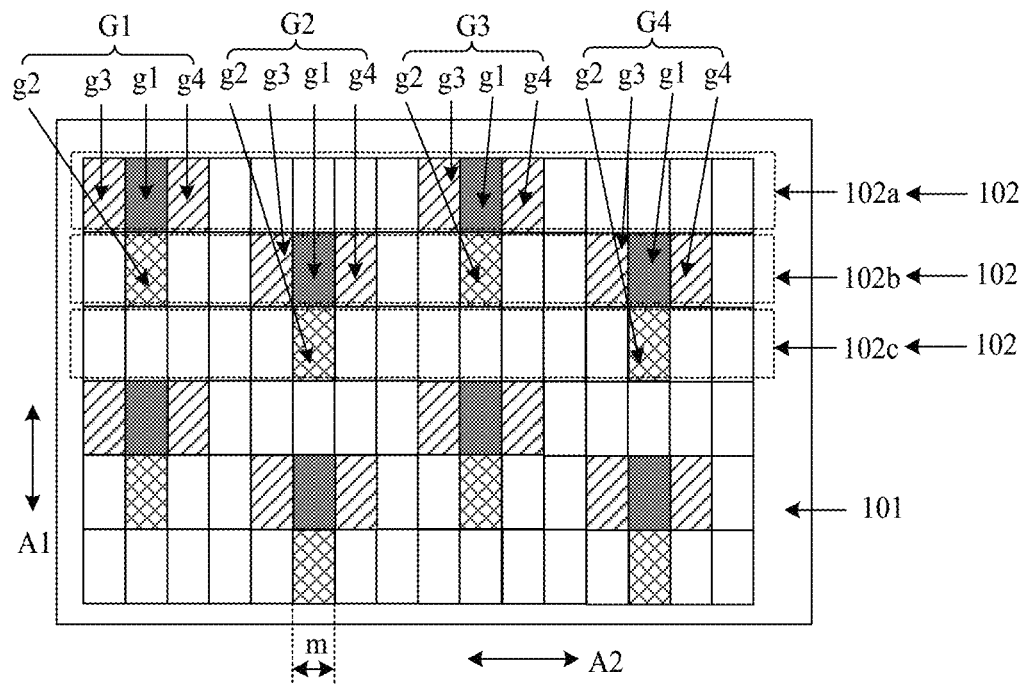
FIG. 17 is a schematic structural diagram of still another display panel according to some embodiments of the present disclosure.

Referring to FIG. 17, it can be seen that the first sub-pixel group 102a includes: a plurality of first sub-pixels g1, a plurality of third sub-pixels g3, and a plurality of fourth sub-pixels g4. The second sub-pixel group 102b includes: a plurality of first sub-pixels g1, a plurality of second sub-pixels g2, a plurality of third sub-pixels g3, and a plurality of fourth sub-pixels g4. The third sub-pixel group 102c includes: a plurality of second sub-pixels g2. The third interval h3 is greater than the first interval h1, and the first interval h1 is greater than the second interval h2.

In the embodiments of the present disclosure, referring to FIG. 17, the first pixel G1, the second pixel G2, the third pixel G3, and the fourth pixel G4 are sequentially arranged along the second direction A2. The sub-pixels sequentially arranged along the second direction A2 in the first sub-pixel group 102a include: the third sub-pixel g3 of the first pixel G1, the first sub-pixel g1 of the first pixel G1, the fourth sub-pixel g4 of the first pixel G1, the third sub-pixel g3 of the third pixel G3, the first sub-pixel g1 of the third pixel G3, and the fourth sub-pixel g4 of the third pixel G3.

The sub-pixels sequentially arranged along the second direction A2 in the second sub-pixel group 102b include: the second sub-pixel g2 of the first pixel G1, the third sub-pixel g3 of the second pixel G2, the first sub-pixel g1 of the second pixel G2, the fourth sub-pixel g4 of the second pixel G2, the second sub-pixel g2 of the third pixel G3, the third sub-pixel g3 of the fourth pixel G4, the first sub-pixel g1 of the fourth pixel G4, and the fourth sub-pixel g4 of the fourth pixel G4.

The sub-pixels sequentially arranged along the second direction A2 in the third sub-pixel group 102c include: the second sub-pixel g2 of the second pixel G2 and the second sub-pixel g2 of the fourth pixel G4.

Every two of the first pixel G1, the second pixel G2, the third pixel G3, and the fourth pixel G4 have a gap along the second direction A2. In conjunction with FIG. 16 and FIG. 17, the two adjacent sub-pixels with the first interval h1 in the first sub-pixel group 102a include: the fourth sub-pixel g4 of the first pixel G1 and the third sub-pixel g3 of the third pixel G3. That is, the fourth sub-pixel g4 of the first pixel G1 and the third sub-pixel g3 of the third pixel G3 have the first interval h1 along the second direction A2.

The two adjacent sub-pixels with the second interval h2 in the second sub-pixel group 102b include: the second sub-pixel g2 of the first pixel G1 and the third sub-pixel g3 of the second pixel G2. Alternatively, the two adjacent sub-pixels with the second interval h2 in the second sub-pixel group 102b include: the fourth sub-pixel g4 of the second pixel G2 and the second sub-pixel g2 of the third pixel G3. Alternatively, the two adjacent sub-pixels with the second interval h2 in the second sub-pixel group 102b include: the second sub-pixel g2 of the third pixel G3 and the third sub-pixel g3 of the fourth pixel G4.

That is, the second sub-pixel g2 of the first pixel G1 and the third sub-pixel g3 of the second pixel G2 have the second interval h2 along the second direction A2. The fourth sub-pixel g4 of the second pixel G2 and the second sub-pixel g2 of the third pixel G3 have the second interval h2 along the second direction A2. The second sub-pixel g2 of the third pixel G3 and the third sub-pixel g3 of the fourth pixel G4 have the second interval h2.

The two adjacent sub-pixels with the third interval h3 in the third sub-pixel group 102c include: the second sub-pixel g2 of the second pixel G2 and the second sub-pixel g2 of the fourth pixel G4. That is, the second sub-pixel g2 of the second pixel G2 and the second sub-pixel g2 of the fourth pixel G4 have the third interval h3.

Referring to FIG. 16 and FIG. 17, the first interval h1 is equal to the length of five sub-pixels along the second direction A2. The second interval h2 is equal to the length of two sub-pixels along the second direction A2. The third interval h3 is equal to the length of the seven sub-pixels along the second direction A2. The white filling in FIG. 16 and FIG. 17 indicates that no sub-pixels are disposed.

Figure 18:
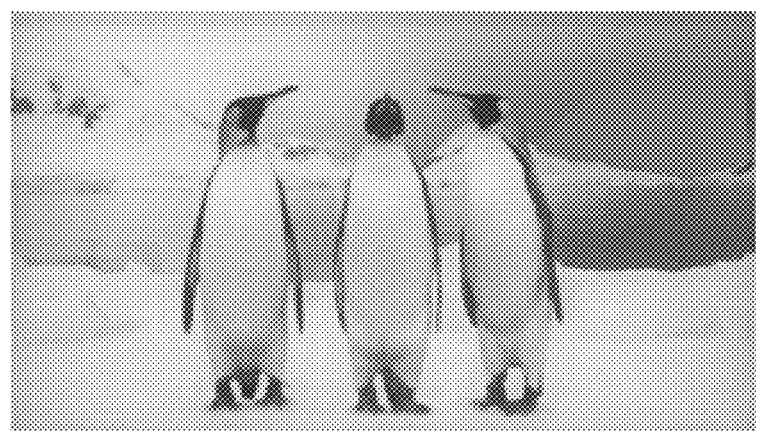
FIG. 18 is a simulation diagram of a diffraction effect of the display panel shown in FIG. 16.

In the embodiments of the present disclosure, the diffraction effect of the display panel shown in FIG. 16 is simulated as shown in FIG. 18. Referring to FIG. 18, it can be seen that the image displayed on the display panel shown in FIG. 16 hardly has a ghost image. That is, the diffraction effect of the display panel shown in FIG. 16 is weak, so that the display effect of the display panel can be ensured.

Certainly, the first interval h1, the second interval h2, and the third interval h3 is equal to the length of other numbers of sub-pixels along the second direction A2, which is not limited in the embodiments of the present disclosure. However, if the arrangement of the pixels in the display panel is the same as the arrangement in FIG. 16, and only the gap between adjacent pixels in the second direction A2 is adjusted (that is, the sizes of the first interval h1, the second interval h2, and the third interval h3 are adjusted), the difference between the third interval h3 and the first interval h1 is equal to the length of the two sub-pixels along the second direction A2. The first interval h1 is equal to the sum of twice the second interval h2 and the length of one sub-pixel along the second direction A2. The third interval h3 is equal to the sum of three times the second interval h2 and the length of one sub-pixel along the second direction A2.

That is, in the display panel 10 shown in FIG. 16, the first interval h1, the second interval h2, and the third interval h3 satisfy: h3−h1=2×m, h1=2×h2+m, h3=3×h2+m, where m is the length of one sub-pixel along the second direction A2.

Figure 19:
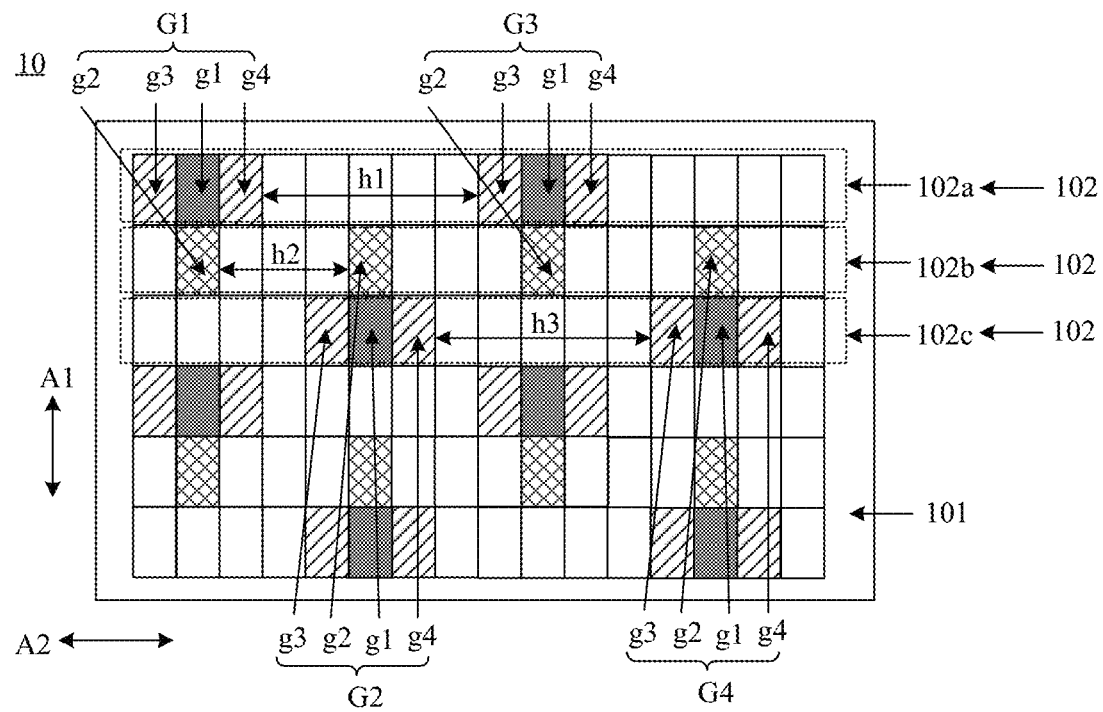
FIG. 19 is a schematic structural diagram of still another display panel according to some embodiments of the present disclosure.

FIG. 19 is a schematic structural diagram of still a further display panel according to some embodiments of the present disclosure. It can be seen with reference to FIG. 19 that the first sub-pixel group 102a includes a plurality of first sub-pixels g1, a plurality of third sub-pixels g3, and a plurality of fourth sub-pixels g4. The second sub-pixel group 102b includes: a plurality of second sub-pixels g2. The third sub-pixel group 102c includes: a plurality of first sub-pixels g1, a plurality of third sub-pixels g3, and a plurality of fourth sub-pixels g4. The third interval h3 is equal to the first interval h1, and the first interval h1 is greater than the second interval h2.

In the embodiments of the present disclosure, referring to FIG. 19, the first pixel G1, the second pixel G2, the third pixel G3, and the fourth pixel G4 are sequentially arranged along the second direction A2. The sub-pixels sequentially arranged along the second direction A2 in the first sub-pixel group 102a include: the third sub-pixel g3 of the first pixel G1, the first sub-pixel g1 of the first pixel G1, the fourth sub-pixel g4 of the first pixel G1, the third sub-pixel g3 of the third pixel G3, the first sub-pixel g1 of the third pixel G3, and the fourth sub-pixel g4 of the third pixel G3.

The sub-pixels sequentially arranged along the second direction A2 in the second sub-pixel group 102b include: the second sub-pixel g2 of the first pixel G1, the second sub-pixel g2 of the second pixel G2, the second sub-pixel g2 of the third pixel G3, and the second sub-pixel g2 of the fourth pixel G4.

The sub-pixels sequentially arranged along the second direction A2 in the third sub-pixel group 102c include: the third sub-pixel g3 of the second pixel G2, the first sub-pixel g1 of the second pixel G2, the fourth sub-pixel g4 of the second pixel G2, the third sub-pixel g3 of the fourth pixel G4, the first sub-pixel g1 of the fourth pixel G4, and the fourth sub-pixel g4 of the fourth pixel G4.

Every two of the first pixel G1, the second pixel G2, the third pixel G3, and the fourth pixel G4 have a gap along the second direction A2. The two adjacent sub-pixels with the first interval h1 in the first sub-pixel group 102a include: the fourth sub-pixel g4 of the first pixel G1 and the third sub-pixel g3 of the third pixel G3.

That is, the fourth sub-pixel g4 of the first pixel G1 and the third sub-pixel g3 of the third pixel G3 have the first interval h1 along the second direction A2.

The two adjacent sub-pixels with the second interval h2 in the second sub-pixel group 102b include: the second sub-pixel g2 of the first pixel G1 and the second sub-pixel g2 of the second pixel G2. Alternatively, the two adjacent sub-pixels with the second interval h2 in the second sub-pixel group 102b include: the second sub-pixel g2 of the second pixel G2 and the second sub-pixel g2 of the third pixel G3. Alternatively, the two adjacent sub-pixels with the second interval h2 in the second sub-pixel group 102b include: the second sub-pixel g2 of the third pixel G3 and the second sub-pixel g2 of the fourth pixel G4.

That is, the second sub-pixel g2 of the first pixel G1 and the second sub-pixel g2 of the second pixel G2 have the second interval h2 along the second direction A2. The second sub-pixel g2 of the second pixel G2 and the second sub-pixel g2 of the third pixel G3 have the second interval h2 along the second direction A2. The second sub-pixel g2 of the third pixel G3 and the second sub-pixel g2 of the fourth pixel G4 have the second interval h2.

The two adjacent sub-pixels with the third interval h3 in the third sub-pixel group 102c include: the fourth sub-pixel g4 of the second pixel G2 and the third sub-pixel g3 of the fourth pixel G4.

That is, the fourth sub-pixel g4 of the second pixel G2 and the third sub-pixel g3 in the fourth pixel G4 have the third interval h3.

Referring to FIG. 19, the first interval h1 is equal to the length of five sub-pixels along the second direction A2, the second interval h2 is equal to the length of three sub-pixels along the second direction A2, and the third interval h3 is equal to the length of five sub-pixels along the second direction A2. The white filling in FIG. 19 indicates that no sub-pixels are disposed.

Figure 20:
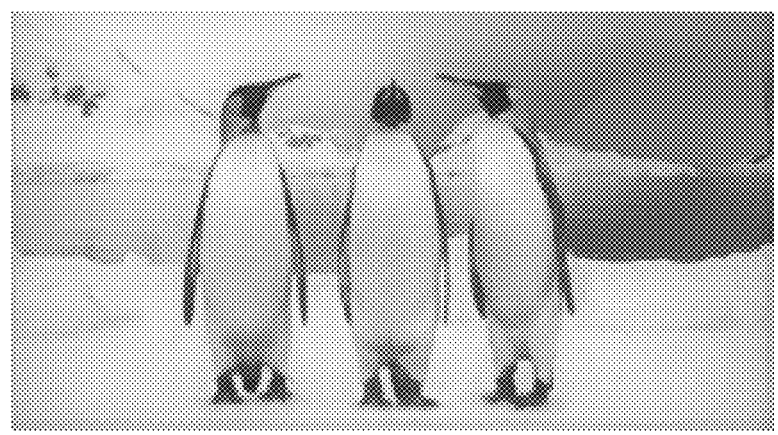
FIG. 20 is a simulation diagram of a diffraction effect of the display panel shown in FIG. 19.

In the embodiments of the present disclosure, the diffraction effect of the display panel shown in FIG. 19 is simulated as shown in FIG. 20. It can be seen with reference to FIG. 20 that the image displayed on the display panel 10 shown in FIG. 19 hardly has a ghost image. That is, the diffraction effect of the display panel 10 shown in FIG. 19 is weak, so that the display effect of the display panel 10 can be ensured.

Certainly, the first interval h1, the second interval h2, and the third interval h3 are equal to the length of other numbers of sub-pixels along the second direction A2, which is not limited in the embodiments of the present disclosure. However, if the arrangement of the pixels in the display panel is the same as the arrangement in FIG. 19, and only the gap between adjacent pixels in the second direction A2 is adjusted (that is, the sizes of the first interval h1, the second interval h2, and the third interval h3 are adjusted), the third interval h3 is equal to the first interval h1, and the first interval h1 is equal to the difference between twice the second interval h2 and the length of one sub-pixel along the second direction A2.

That is, in the display panel 10 shown in FIG. 19, the first interval h1, the second interval h2, and the third interval h3 satisfy: $h1=h3=2\times h2-m$, where m is the length of one sub-pixel along the second direction A2.

In the embodiments of the present disclosure, the ratio of the area of regions where no sub-pixels are disposed in the display panel to the area of the display panel is an aperture ratio of the display panel. The transmittance of the display panel is positively correlated with the aperture ratio of the display panel. That is, the transmittance of the display panel is positively correlated with the area of the regions where no sub-pixels are disposed in the display panel. The larger the area of the regions where no sub-pixels are disposed in the display panel is, the higher the transmittance of the display panel is. The smaller the area of the regions where no sub-pixels are disposed in the display panel is, the lower the transmittance of the display panel is.

Exemplarily, the area of the regions where no sub-pixels are disposed in the display panel shown in FIG. 13 accounts for ½ of the area of the display panel (the aperture ratio is 50%). The area of the regions where no sub-pixels are disposed in the display panel shown in FIG. 16 and FIG. 18 accounts for ⅔ of the area of the display panel (the aperture ratio is approximately 66.7%). Therefore, the transmittance of the display panel shown in FIG. 16 and FIG. 18 is greater than the transmittance of the display panel shown in FIG. 13.

In summary, the embodiments of the present disclosure provide a display panel. In the display panel, the first sub-pixel group has two adjacent sub-pixels with the first interval, and the second sub-pixel group has two adjacent sub-pixels with the second interval. The first interval is different from the second interval, so that the diffraction order of light passing through the gap between the two sub-pixels in the first sub-pixel group is different from that of the light passing through the gap between the two sub-pixels in the second sub-pixel group. Therefore, the diffraction effect can be reduced, and the display effect of the display panel is improved.

Figure 21:
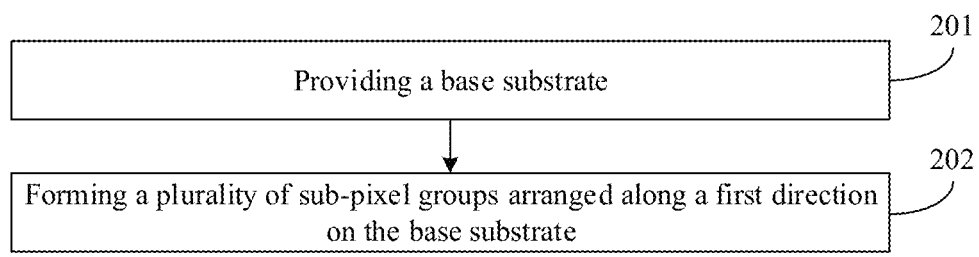
FIG. 21 is a flowchart of a method of manufacturing a display panel according to some embodiments of the present disclosure.

FIG. 21 is a flowchart of a method of manufacturing a display panel according to some embodiments of the present disclosure. The manufacturing method is adopted to manufacture the display panel according to the above embodiments. Referring to FIG. 21, the method includes following steps.

In step 201: a base substrate is provided.

In the embodiments of the present disclosure, when the display panel 10 is manufactured, a base substrate 101 is acquired at first. The base substrate is a glass substrate.

In step 202, a plurality of sub-pixel groups arranged along a first direction are formed on the base substrate.

In the embodiments of the present disclosure, the sub-pixel group 102 includes a plurality of sub-pixels arranged along the second direction A2. The second direction A2 intersects the first direction. For example, in FIG. 11, the second direction A2 is perpendicular to the first direction A1.

Referring to FIG. 11, the plurality of sub-pixel groups 102 have a first sub-pixel group 102a and a second sub-pixel group 102b which are adjacent to each other. The first sub-pixel group 102a has two adjacent sub-pixels (X1 and X2) with a first interval h1, and the second sub-pixel group 102b has two adjacent sub-pixels (Y1 and Y2) with a second interval h2. The first interval h1 is different from the second interval h2.

In the embodiments of the present disclosure, the first interval h1 of the two adjacent sub-pixels (X1 and X2) in the first sub-pixel group 102a is different from the second interval h2 of the two adjacent sub-pixels (Y1 and Y2) in the second sub-pixel group 102b. Therefore, the diffraction order of light passing through the gap between two adjacent sub-pixels (X1 and X2) in the first sub-pixel group 102a is different from that of the light passing through the gap between two adjacent sub-pixels (Y1 and Y2) in the second sub-pixel group 102b. Hence, the diffraction effect of the light emitting from the gap between adjacent sub-pixels can be reduced, and the manufactured display panel 10 has a good display effect.

In summary, the embodiments of the present disclosure provide a method of manufacturing a display panel. In the display panel, the first sub-pixel group has two adjacent sub-pixels with the first interval, and the second sub-pixel group has two adjacent sub-pixels with the second interval. The first interval is different from the second interval, so that the diffraction order of light passing through the gap between the two sub-pixels in the first sub-pixel group is different from that of the light passing through the gap between the two sub-pixels in the second sub-pixel group. Therefore, the diffraction effect can be reduced, and the display effect of the display panel is improved.

Figure 22:
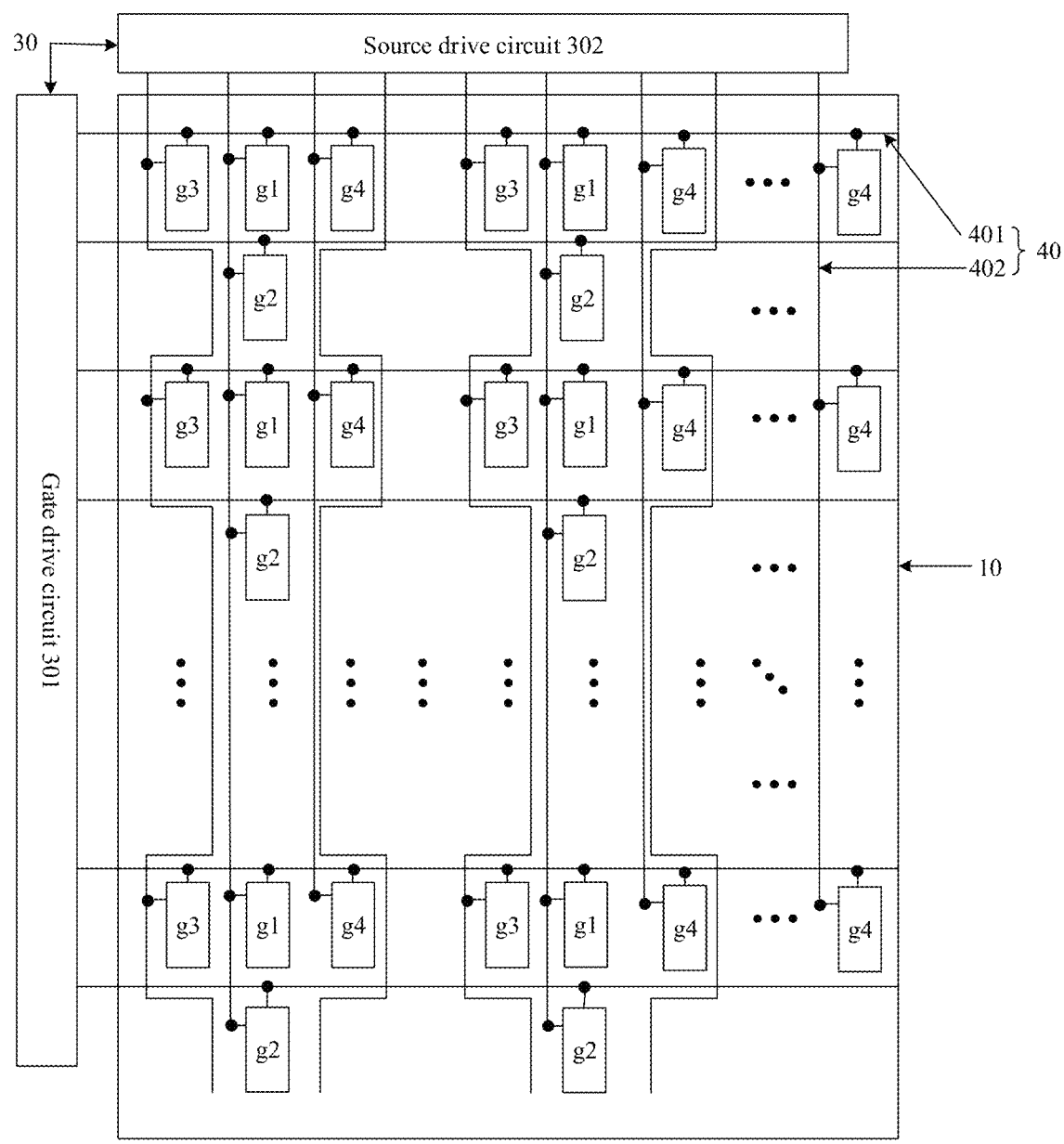
FIG. 22 is a schematic structural diagram of a display device according to some embodiments of the present disclosure.

FIG. 22 is a schematic structural diagram of a display device according to some embodiments of the present disclosure. It can be seen with reference to FIG. 22 that the display device includes a drive circuit 30 and a display panel 10. The display panel 10 is any one of the display panels shown in FIG. 11, FIG. 12, FIG. 13, FIG. 16, and FIG. 17.

The drive circuit 30 is connected to a plurality of sub-pixels (the first sub-pixel g1, the second sub-pixel g2, the third sub-pixel g3, and the fourth sub-pixel g4) in the display panel 10. The drive circuit 30 provides drive signals for the sub-pixels.

In some embodiments, the display device further includes: a plurality of drive lines 40. One end of each drive line 40 is connected to the drive circuit 30, and the other end of each drive line 40 is connected to the plurality of sub-pixels.

The drive lines 40 include at least one of gate lines, data lines, emission lines or reset lines.

Exemplarily, referring to FIG. 22, the drive circuit 30 includes a gate drive circuit 301 and a source drive circuit 302. The plurality of drive lines 40 include: a plurality of gate lines 401 and a plurality of data lines 402. One end of the gate line 401 is connected to the gate drive circuit 301, and the other end of the gate line 401 is connected to the sub-pixels. One end of the data line 402 is connected to the source drive circuit 302, and the other end of the data line 402 is connected to the sub-pixels.

Continuing referring to FIG. 22, each of the data lines 402 passes through a plurality of pixel islands along the first direction A1 and is connected to at least one sub-pixel in each of the plurality of pixel islands passed through; and each of gate lines 401 passes through a plurality of pixel islands along the second direction A2 and is connected to at least one sub-pixel in each of the plurality of pixel islands passed through.

In some embodiments, the gate drive circuit 301 is connected to each row of sub-pixels in the display panel 10 through the gate line 401, and is configured to provide a gate drive signal for each row of sub-pixels. The source drive circuit 302 is connected to each column of sub-pixels in the display panel 10 through the data line 402 and is configured to provide a data signal for each column of sub-pixels.

In the embodiments of the present disclosure, a gap between adjacent sub-pixels with an interval is a light transmission region and an orthographic projection of the drive line on the base substrate 101 in the display panel 10 is in the edge region of the orthographic projection of a gap between two adjacent sub-pixels with an interval in the display panel 10 on the base substrate 101, such that the drive line 40 is prevented from interfering with the light transmitting through the gap. Thus, the diffraction effect can be reduced, the light transmittance is ensured, and the display effect of the display device is better.

Exemplarily, referring to FIG. 22, the orthographic projection of the data line 402 on the base substrate 101 is in the edge region of the orthographic projection of the gap between two adjacent sub-pixels with an interval on the base substrate 101. Certainly, the orthographic projection of the gate line 401 on the base substrate 101 is also in the edge region of the orthographic projection of the gap between two adjacent sub-pixels with an interval on the base substrate 101.

Figure 23:
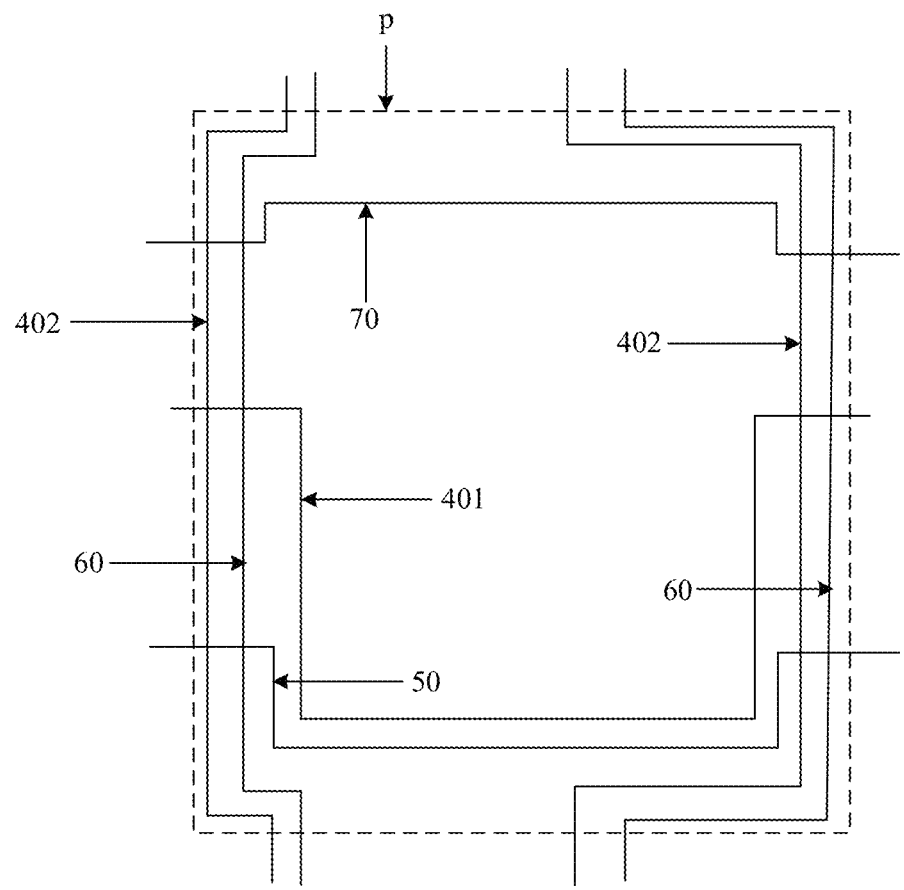
FIG. 23 is a schematic diagram of a partial structure of a display device according to some embodiments of the present disclosure.

FIG. 23 is a schematic diagram of a partial structure of a display device according to some embodiments of the present disclosure. Referring to FIG. 23, it can be seen that the display device further includes: a plurality of emission (EM) lines 50, a plurality of power lines and a plurality of reset lines 70. The power line 60 is a VDD line. FIG. 23 shows one EM line 50, two power lines 60, and one reset line 70.

The orthographic projections of the EM line 50, the power line 60, and the reset line 70 on the base substrate 101 are all in the edge region of the orthographic projection of the gap p between two adjacent sub-pixels with an interval on the base substrate 101. Therefore, each line is prevented from interfering with the light passing through the gap, the diffraction effect can be reduced, the transmittance of light is ensured, and the display effect of the display device is better.

In the embodiments of the present disclosure, the display panel is a transparent display panel, and correspondingly the display device is a transparent display device. Therefore, in order to ensure the transmittance of all regions of the display panel, the sub-pixels in all regions of the display panel all adopt the arrangement according to the above embodiments.

Alternatively, the display device includes an image sensor. The image sensor is disposed in a target region of the display panel. Therefore, in order to ensure the transmittance of the target region of the display panel, the sub-pixels in the target region of the display panel adopts the arrangement according to the above embodiments. The sub-pixels in other regions of the display panel except the target region are arranged in an array. In some embodiments, the image sensor is a front camera of the display device for capturing images.

In some embodiments, the display device is any product or component with a display function and a fingerprint recognition function, such as an organic light-emitting diode (OLED) display device, a piece of electronic paper, a mobile phone, a tablet computer, a television, a display, a notebook computer, a digital photo frame, or a navigator.

Described above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising:
   a base substrate; and
   a plurality of sub-pixel groups disposed on the base substrate and arranged along a first direction, each sub-pixel group of the plurality of sub-pixel groups comprising: a plurality of sub-pixels arranged along a second direction, the second direction intersecting the first direction;
   wherein the plurality of sub-pixel groups comprises a first sub-pixel group and a second sub-pixel group which are adjacent to each other, the first sub-pixel group comprising two adjacent sub-pixels with a first interval therebetween, and the second sub-pixel group comprising two adjacent sub-pixels with a second interval therebetween, the first interval being different from the second interval;
   the sub-pixels in the plurality of sub-pixel groups are capable of being divided into a plurality of pixel islands, each pixel island of the plurality of pixel islands comprises a plurality of sub-pixels, and two adjacent pixel islands have a gap in the second direction; and
   each pixel island of the plurality of pixel islands comprises a first sub-pixel, a second sub-pixel, a third sub-pixel, and a fourth sub-pixel; wherein the first sub-pixel and the second sub-pixel are arranged along the first direction, the third sub-pixel and the fourth sub-pixel are on both sides of the first sub-pixel respectively, and the third sub-pixel, the first sub-pixel, and the fourth sub-pixel are arranged along the second direction.

2. The display panel according to claim 1, wherein the plurality of pixel islands comprise a plurality of pixel island columns along the first direction and a plurality of pixel island rows along the second direction;
   the pixel islands in a same column are aligned along the first direction, the pixel islands in a same row are aligned along the second direction, adjacent pixel islands are arranged in a staggered manner in columns and in rows.

3. The display panel according to claim 1, wherein the first sub-pixel group comprises: a plurality of first sub-pixels, a plurality of third sub-pixels, and a plurality of fourth sub-pixels; and the second sub-pixel group comprises: a plurality of second sub-pixels;
   wherein the first interval is smaller than the second interval.

4. The display panel according to claim 3, wherein a length of each of the sub-pixels along the second direction is m, and the first interval and the second interval satisfy:
   h2−h1=2×m, wherein h1 is the first interval and h2 is the second interval.

5. The display panel according to claim 4, wherein the first interval is equal to a length of one sub-pixel along the second direction, and the second interval is equal to a length of three sub-pixels along the second direction.

6. The display panel according to claim 4, wherein the first interval is equal to a length of two sub-pixels along the second direction, and the second interval is equal to a length of four sub-pixels along the second direction.

7. The display panel according to claim 1, wherein the plurality of sub-pixel groups further comprises a third sub-pixel group adjacent to the second sub-pixel group, the third sub-pixel group comprising two adjacent sub-pixels with a third interval therebetween, the third interval being different from the second interval.

8. The display panel according to claim 7, wherein the first sub-pixel group comprises: a plurality of first sub-pixels, a plurality of third sub-pixels, and a plurality of fourth sub-pixels, the second sub-pixel group comprises: a plurality of first sub-pixels, a plurality of second sub-pixels, a plurality of third sub-pixels, and a plurality of fourth sub-pixels, and the third sub-pixel group comprises: a plurality of second sub-pixels;
   wherein the third interval is greater than the first interval, and the first interval is greater than the second interval.

9. The display panel according to claim 8, wherein a length of each sub-pixel along the second direction is m; and the first interval, the second interval, and the third interval satisfy:
   h3−h1=2×m; h1=2×h2+m; h3=3×h2+m, wherein h1 is the first interval, h2 is the second interval, and h3 is the third interval.

10. The display panel according to claim 9, wherein the first interval is equal to a length of five sub-pixels along the second direction, the second interval is equal to a length of two sub-pixels along the second direction, and the third interval is equal to a length of seven sub-pixels along the second direction.

11. The display panel according to claim 7, wherein the first sub-pixel group comprises: a plurality of first sub-pixels, a plurality of third sub-pixels, and a plurality of fourth sub-pixels, the second sub-pixel group comprises: a plurality of second sub-pixels, and the third sub-pixel group comprises: a plurality of first sub-pixels, a plurality of third sub-pixels, and a plurality of fourth sub-pixels;
   wherein the third interval is equal to the first interval, and the first interval is greater than the second interval.

12. The display panel according to claim 11, wherein a length of each sub-pixel along the second direction is m; and the first interval, the second interval, and the third interval satisfy:
   h1=h3=2×h2−m, wherein h1 is the first interval, h2 is the second interval, and h3 is the third interval.

13. The display panel according to claim 12, wherein the first interval is equal to a length of five sub-pixels along the second direction, the second interval is equal to a length of three sub-pixels along the second direction, and the third interval is equal to a length of five sub-pixels along the second direction.

14. The display panel according to claim 1, wherein a color of the first sub-pixel is one of red and blue, a color of the second sub-pixel is another of red and blue, and a color of the third sub-pixel and a color of the fourth sub-pixel are both green.

15. The display panel according to claim 1, wherein the first direction is a pixel column direction, and the second direction is a pixel row direction.

16. A display device, comprising: a drive circuit and a display panel; wherein
the display panel comprises: a base substrate; and a plurality of sub-pixel groups disposed on the base substrate and arranged along a first direction, wherein each sub-pixel group of the plurality of sub-pixel groups comprises: a plurality of sub-pixels arranged along a second direction, and the second direction intersects the first direction; and the plurality of sub-pixel groups comprises a first sub-pixel group and a second sub-pixel group which are adjacent to each other, the first sub-pixel group comprising two adjacent sub-pixels with a first interval therebetween, the second sub-pixel group comprising two adjacent sub-pixels with a second interval therebetween, and the first interval being different from the second interval;
the sub-pixels in the plurality of sub-pixel groups are capable of being divided into a plurality of pixel islands, each pixel island of the plurality of pixel islands comprises a plurality of sub-pixels, and two adjacent pixel islands have a gap in the second direction; and
each pixel island of the plurality of pixel islands comprises a first sub-pixel, a second sub-pixel, a third sub-pixel, and a fourth sub-pixel; wherein the first sub-pixel and the second sub-pixel are arranged along the first direction, the third sub-pixel and the fourth sub-pixel are on both sides of the first sub-pixel respectively, and the third sub-pixel, the first sub-pixel, and the fourth sub-pixel are arranged along the second direction; and
the drive circuit is connected to the plurality of sub-pixels of the plurality of pixel islands, and the drive circuit is configured to provide drive signals for the plurality of sub-pixels of the plurality of pixel islands.

17. The display device according to claim 16, further comprising: a plurality of drive lines, wherein the plurality of drive lines are connected to the drive circuit; and
an orthographic projection of the drive lines on the base substrate is in an edge region of an orthographic projection of a gap between two adjacent sub-pixels with an interval therebetween on the base substrate.

18. The display device according to claim 17, wherein the drive lines comprise at least one of gate lines, data lines, emission lines, or reset lines.

19. The display device according to claim 18, wherein in a case that the drive lines comprise the gate lines and data lines, each of the data lines passes through a subset of pixel islands along the first direction and is connected to at least one sub-pixel in each pixel island of the subset of pixel islands passed through; and
each of gate lines passes through a subset of of pixel islands along the second direction and is connected to at least one sub-pixel in each pixel island of the subset of pixel islands passed through.

20. The display device according to claim 16, wherein a gap between adjacent sub-pixels with an interval is a light transmission region.

* * * * *